(12) United States Patent
Meyer et al.

(10) Patent No.: US 11,264,356 B2
(45) Date of Patent: Mar. 1, 2022

(54) BATCH MANUFACTURE OF PACKAGES BY SHEET SEPARATED INTO CARRIERS AFTER MOUNTING OF ELECTRONIC COMPONENTS

(71) Applicant: Infineon Technologies AG, Neubiberg (DE)

(72) Inventors: Thorsten Meyer, Regensburg (DE); Thomas Behrens, Wenzenbach (DE); Andreas Grassmann, Regensburg (DE); Martin Gruber, Schwandorf (DE); Thorsten Scharf, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/842,417

(22) Filed: Apr. 7, 2020

(65) Prior Publication Data

US 2020/0365553 A1    Nov. 19, 2020

(30) Foreign Application Priority Data

May 15, 2019 (DE) .......................... 102019112778.5

(51) Int. Cl.
*H01L 21/78* (2006.01)
*H01L 23/00* (2006.01)
(Continued)

(52) U.S. Cl.
CPC .......... *H01L 24/97* (2013.01); *H01L 21/4842* (2013.01); *H01L 21/561* (2013.01);
(Continued)

(58) Field of Classification Search
CPC ..... H01L 24/97; H01L 24/85; H01L 21/4842; H01L 21/565; H01L 21/78; H01L 23/49541; H01L 23/3121; H01L 24/48; H01L 24/84; H01L 24/40; H01L 24/92; H01L 24/73; H01L 24/32; H01L 21/561; H01L 24/83; H01L 2224/32245;
(Continued)

(56) References Cited

U.S. PATENT DOCUMENTS 7,790,500 B2 * 9/2010 Ramos .............. H01L 23/49503
                                                         438/106
8,084,299 B2 * 12/2011 Tan ..................... H01L 23/4951
                                                         438/111
(Continued)

FOREIGN PATENT DOCUMENTS

DE    10 2016 107 792    11/2017
DE    10 2017 217 595     4/2018

*Primary Examiner* — Vu A Vu
(74) *Attorney, Agent, or Firm* — Dicke, Billig & Czaja, PLLC

(57) ABSTRACT

A method of manufacturing packages is disclosed. In one example, the method comprises providing an electrically conductive sheet being continuous at least in a mounting region, mounting first main surfaces of a plurality of electronic components on the continuous mounting region of the sheet and forming interconnect structures for electrically coupling second main surfaces of the electronic components with the sheet. The second main surfaces oppose the first main surfaces. After the forming, structuring the sheet.

21 Claims, 8 Drawing Sheets

(51) Int. Cl.
*H01L 21/48* (2006.01)
*H01L 21/56* (2006.01)
*H01L 23/495* (2006.01)
*H01L 23/31* (2006.01)

(52) U.S. Cl.
CPC ............ *H01L 21/565* (2013.01); *H01L 21/78* (2013.01); *H01L 23/3121* (2013.01); *H01L 23/49541* (2013.01); *H01L 24/32* (2013.01); *H01L 24/40* (2013.01); *H01L 24/48* (2013.01); *H01L 24/73* (2013.01); *H01L 24/83* (2013.01); *H01L 24/84* (2013.01); *H01L 24/85* (2013.01); *H01L 24/92* (2013.01); *H01L 2224/32245* (2013.01); *H01L 2224/40247* (2013.01); *H01L 2224/48091* (2013.01); *H01L 2224/48106* (2013.01); *H01L 2224/48247* (2013.01); *H01L 2224/73263* (2013.01); *H01L 2224/73265* (2013.01); *H01L 2224/92246* (2013.01); *H01L 2224/92247* (2013.01)

(58) Field of Classification Search
CPC .......... H01L 2224/48091; H01L 2224/48106; H01L 2224/48247; H01L 2224/92246; H01L 2224/92247; H01L 2224/73263; H01L 2224/73265; H01L 2224/40247; H01L 23/3107; H01L 21/4832; H01L 23/49524; H01L 23/49562; H01L 21/4821; H01L 23/3114
USPC .......................................................... 257/676
See application file for complete search history.

(56) References Cited

U.S. PATENT DOCUMENTS

| | | | | |
|---|---|---|---|---|
| 8,115,285 | B2 * | 2/2012 | Chen | H01L 23/49548 257/676 |
| 8,389,334 | B2 * | 3/2013 | Poddar | H01L 24/97 438/113 |
| 8,598,690 | B2 * | 12/2013 | Chandra | H01L 24/97 257/659 |
| 8,629,567 | B2 * | 1/2014 | Do | H01L 23/49575 257/787 |
| 10,128,173 | B2 * | 11/2018 | Cho | H01L 23/49524 |
| 10,566,309 | B2 | 2/2020 | Meyer et al. | |
| 2005/0026323 | A1 | 2/2005 | Wada et al. | |
| 2006/0060891 | A1 | 3/2006 | Pavier | |
| 2010/0084748 | A1 | 4/2010 | Sadeghi et al. | |
| 2012/0043660 | A1 | 2/2012 | Poddar et al. | |
| 2016/0056092 | A1 * | 2/2016 | Otremba | H01L 25/0655 257/676 |
| 2017/0317016 | A1 | 11/2017 | Heinrich et al. | |

* cited by examiner

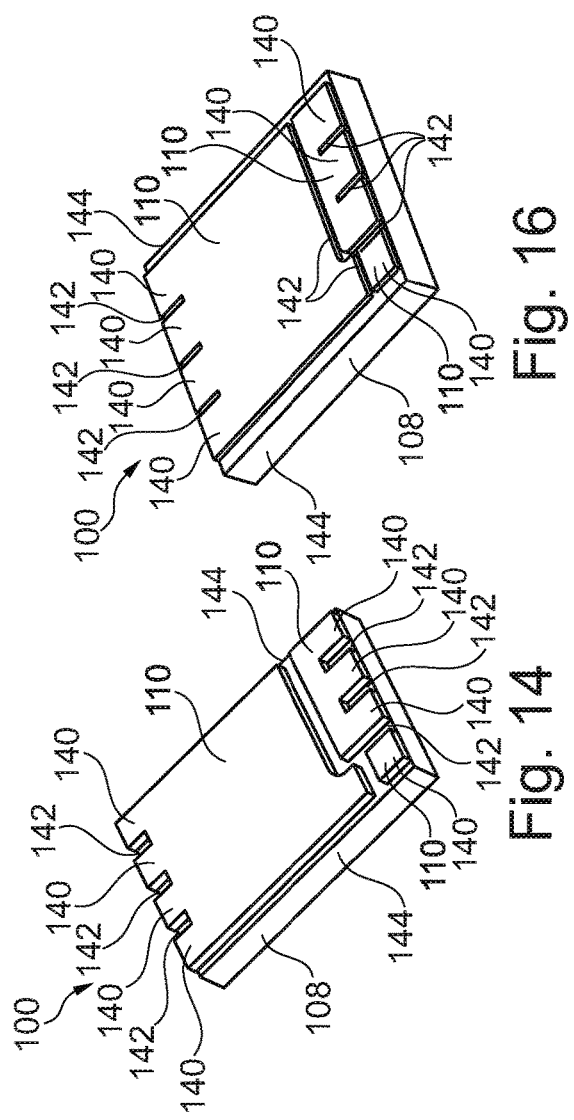

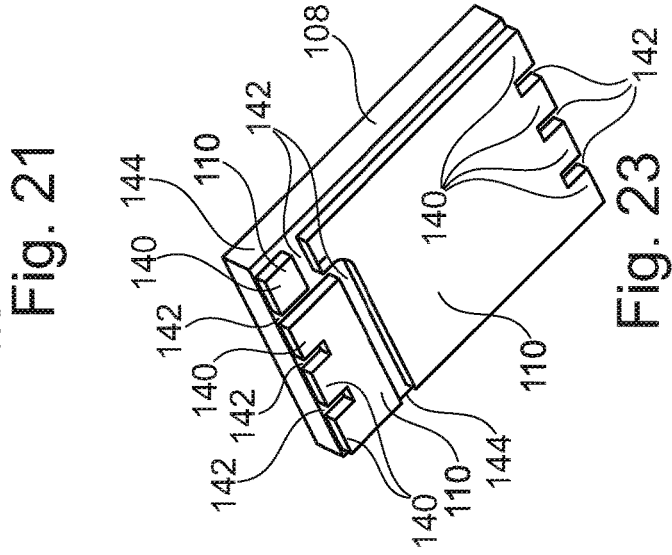
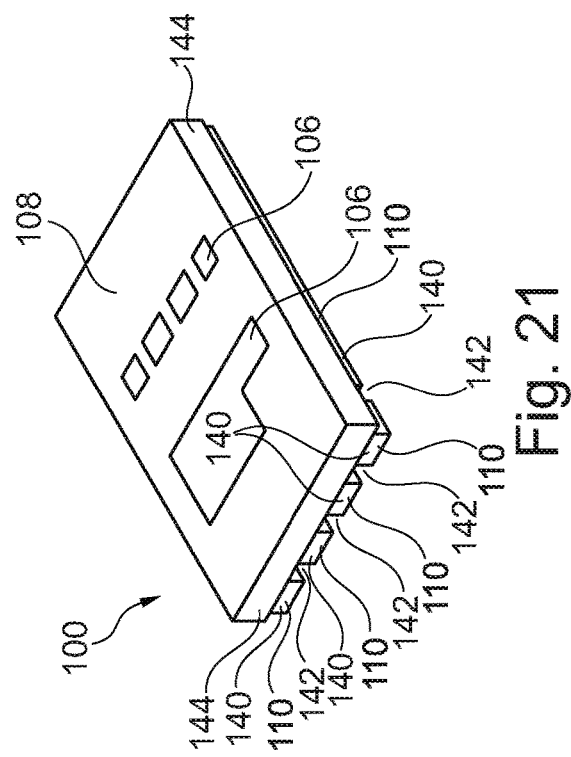
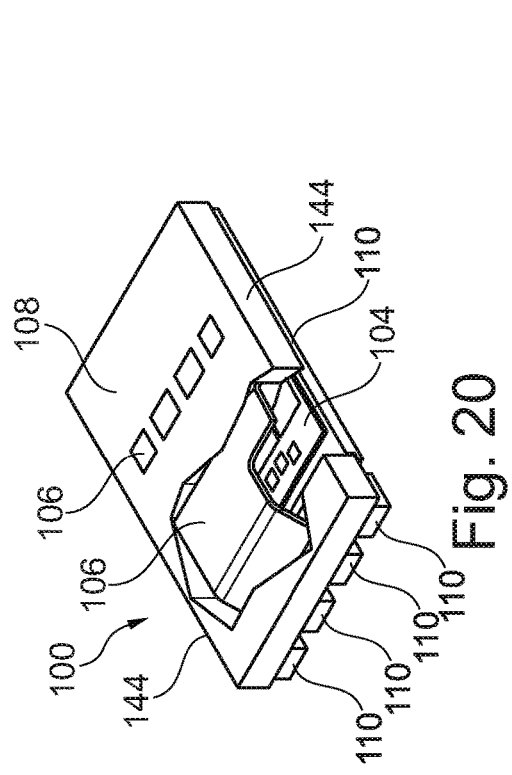
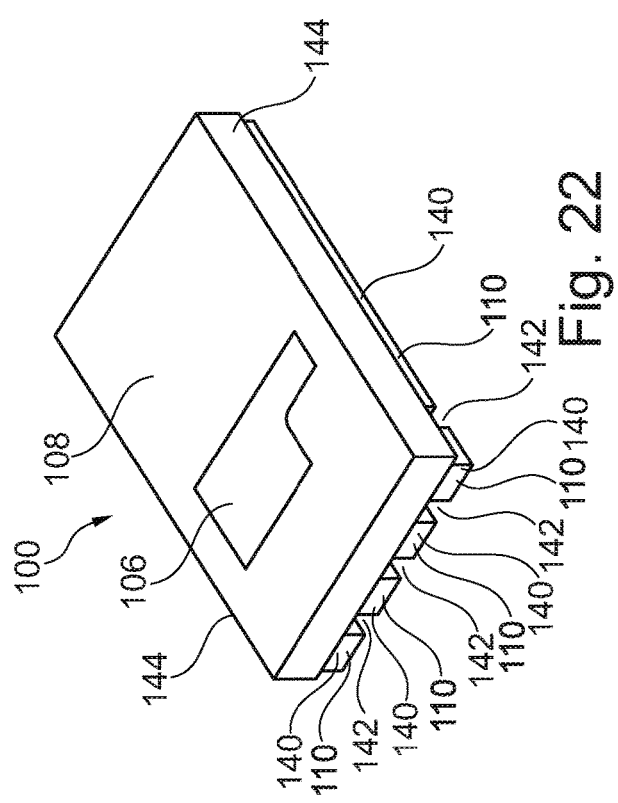

BATCH MANUFACTURE OF PACKAGES BY SHEET SEPARATED INTO CARRIERS AFTER MOUNTING OF ELECTRONIC COMPONENTS

CROSS-REFERENCE TO RELATED APPLICATION

This Utility Patent Application claims priority to German Patent Application No. 10 2019 112 778.5, filed May 15, 2019, which is incorporated herein by reference.

BACKGROUND

The present invention relates to methods of manufacturing packages, and to a package.

A package may comprise an electronic component, such as a semiconductor chip, mounted on a carrier, such as a leadframe. Packages may be embodied as encapsulated electronic component mounted on a carrier with electrical connects extending out of the encapsulant and being coupled with an electronic periphery.

SUMMARY

There is a need to efficiently manufacture packages.

According to an exemplary embodiment, a method of manufacturing packages is provided, wherein the method comprises providing an electrically conductive sheet being continuous at least in a mounting region, mounting first main surfaces of a plurality of electronic components on the continuous mounting region of the sheet, forming interconnect structures for electrically coupling second main surfaces of the electronic components with the sheet, wherein the second main surfaces oppose the first main surfaces, and after the forming, structuring the sheet.

According to another exemplary embodiment, a method of manufacturing packages is provided, wherein the method comprises providing an electrically conductive substantially continuous sheet, mounting a plurality of electronic components, having a vertical current flow during operation, on the sheet, at least partially encapsulating the electronic components by an encapsulant, and after the encapsulating, patterning the sheet from a non-encapsulated back side of the sheet to thereby form individual carriers for each package.

According to yet another exemplary embodiment, a package is provided, wherein the package comprises a carrier structured into a plurality of sub-structures spaced by at least one gap, at least one electronic component mounted with its lower main surface on the carrier, at least one interconnect structure electrically coupling an upper main surface of the at least one electronic component with the carrier, and an encapsulant at least partially encapsulating the at least one electronic component and partially encapsulating the carrier in such a way that the at least one gap is non-encapsulated.

According to an exemplary embodiment, a manufacturing architecture for producing a plurality of packages simultaneously is provided, wherein an electrically conductive and substantially or entirely continuous sheet is used for supporting components, interconnect structures and an encapsulant before structuring or patterning the sheet into separate carriers for the individual packages. By taking this measure, the continuous sheet may serve, during a significant part of the manufacturing process, as a strong mechanical support structure which simplifies handling of the tiny electronic components and which also renders formation of interconnect structures simple. Only at a very late stage of the manufacturing process and in particular after having formed interconnect structures connecting an upper main surface of the mounted electronic components with an upper main surface of the sheet, the sheet is then structured into separate and in particular discontinuous portions. Such portions may then form carriers for mechanically carrying and electrically connecting the respective electronic component(s). Thus, an efficient, simple and failure-robust method of manufacturing a large number of packages with high reliability can be obtained.

As a consequence of the described manufacturing process, obtained packages may have portions of the carrier separated by one or more gaps which are not covered by encapsulant material, since the carrier portions separated by the gaps have been produced as patterned portions of the sheet only after encapsulation. The gaps have thus been previously filled with sheet material when encapsulation occurs.

According to an exemplary embodiment, structuring of an electrically conductive continuous sheet into carriers (for example copper leadframes) for packages may be done after the application of a first level interconnect and/or after encapsulation or housing (for instance by molding) in large format by parallel processing. This may allow for panel packaging with low effort and high flexibility as well as for a pre-packaging option.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 14 and FIG. 15 show different views of a package manufactured by a method according to an exemplary embodiment.

FIG. 16 and FIG. 17 show different views of a package manufactured by a method according to another exemplary embodiment.

FIG. 18 and FIG. 19 show different views of a package manufactured by a method according to still another exemplary embodiment.

FIG. 20 to FIG. 23 show different views of packages manufactured by a method according to an exemplary embodiment.

DETAILED DESCRIPTION

Figure 1:
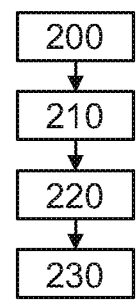
FIG. 1 illustrates a block diagram of a method of manufacturing packages according to an exemplary embodiment.

In the following, further exemplary embodiments of the methods and the package will be explained.

In the context of the present application, the term "package" may particularly denote an electronic device comprising one or more electronic components mounted on a carrier and optionally packaged using an encapsulant. Further optionally, one or more electrically conductive contact elements or interconnect structures (such as bond wires or clips) may be implemented in a package, for instance for electrically coupling the electronic component with the carrier.

In the context of the present application, the term "continuous sheet" may particularly denote a flat layer or plate shaped structure being free of through-holes at least in a central section thereof in which the electronic components are to be mounted on the sheet during the manufacturing process. The electrically conductive continuous sheet may comprise electrically conductive material, and optionally additionally electrically insulating material, or may consist exclusively of electrically conductive material. For instance, the continuous sheet may be a copper foil or plate.

In the context of the present application, the term "substantially continuous sheet" may particularly denote a sheet as described in the previous paragraph being continuous in a mounting region (in particular a central region of the sheet, which may for instance encompass at least 90% of the surface of the sheet), in which mounting region the electronic components are mounted. However, it may for instance be possible that the sheet has one or more alignment recesses in a peripheral portion thereof, i.e. outside of the mounting region. In such peripheral portions, also a handling provision for simplifying handling of the sheet by a user or a machine may be provided. Such alignment recesses, handling provisions or the like however do not serve for defining carriers for packages to be manufactured based on such a substantially continuous sheet.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "interconnect structures" may particularly denote electrically conductive connections between the electronic components and the sheet (wherein the sheet may serve as preform of the respective carriers). These interconnect structures may be provided in addition to the sheet, i.e. may be structures being separate from the sheet. For instance, such interconnect structures may form a first level interconnection and may for example be composed of clips, bond wires and/or bond ribbons.

In the context of the present application, the term "encapsulant" may particularly denote a substantially electrically insulating and preferably thermally conductive material surrounding (for example hermetically surrounding) an electronic component and optionally part of a carrier to provide mechanical protection, electrical insulation, and optionally a contribution to heat removal during operation. Such an encapsulant may for instance be a mold compound.

In an embodiment, the electrically conductive continuous sheet is also thermally conductive. For instance, this can be accomplished by copper and/or aluminum material of the sheet. After formation of separate carriers based on the sheet, the sheet can then also be used simultaneously for removing heat from the electronic components during operation of the packages.

In an embodiment, the method comprises, prior to the structuring, at least partially encapsulating the electronic components and the interconnect structures by an encapsulant. Thus, the part of the manufacturing process during which the continuous electrically conductive sheet remains an integral structure without being patterned into carrier sections can be extended to also include an encapsulation process. In such an embodiment, the mechanical support function of the continuous sheet may also be maintained during encapsulation, in particular molding.

In an embodiment, the method comprises structuring the sheet to thereby form individual carriers for each package. In the context of the present application, the term "carrier" may particularly denote a support structure which serves for carrying one or more electronic components, i.e. as a mechanical support for the one or more electronic components. Such a carrier may also contribute to the electric interconnection between the electronic component(s) and the periphery of the package, for instance may comprise electrically conductive connection structures and/or may be coupled with one or more pads of an electronic component by a respective interconnect structure. In other words, the carrier may fulfil a mechanical support function and optionally an electric connection function. Each carrier being separated by such a structuring or patterning procedure may be specifically assigned to a dedicated package and to at least one of the electronic components. In other words, a respective one of the electronic components may be mounted on each of the carriers. It is also possible that multiple electronic components are mounted on the same carrier.

In an embodiment, the method comprises separating the structure obtained after structuring into separate packages, each at least comprising one of the carriers, at least one of the electronic components, at least one of the interconnect structures, and a portion of the encapsulant. By taking this measure, a plurality of packages may be obtained each comprising at least one electronic component on a respective carrier being electrically connected by a respective one of the interconnect structures and being encapsulated by an encapsulant such as a mold compound. Hence, at the end of such a manufacturing procedure, the plurality of packages or modules may be obtained with the mentioned construction.

In an embodiment, the method comprises structuring the sheet so that each of the carriers comprises a die pad and a plurality of leads. The method may thus comprise structuring the sheet to thereby form a leadframe structure. In other words, the patterning or structuring procedure may be carried out in such a way so as to define separate leadframe portions for each later package. In such embodiments, a respective electronic component may be mounted on the die pad. The leads may extend and may separate from the die pad in an outward direction so as to serve as terminals for electrically contacting the encapsulated electronic component after encapsulating. An electric coupling between an electronic component and the leads may be accomplished by the interconnect structure which may electrically bridge and thereby couple a main surface of the electronic component with a contact surface of a respective one of the leads.

A leadframe may thus comprise a set of pads, for instance a die pad and in addition one or more bond pads. A leadframe may be a sheet-like metallic structure which can be patterned so as to form one or more die pads or mounting sections for mounting the one or more electronic components of the package, and one or more lead sections for an electric connection of the package to an electronic environment when the electronic component(s) is/are mounted on the leadframe. In an embodiment, the leadframe may be a metal plate (in particular made of copper) which may be patterned, for instance by etching or laser processing. Forming the chip carrier as a leadframe is a cost-efficient and mechanically as well as electrically advantageous configuration in which a low ohmic connection of the at least one electronic component can be combined with a robust support capability of the leadframe. Furthermore, a leadframe may contribute to the thermal conductivity of the package and may remove heat generated during operation of the electronic component(s) as a result of the high thermal conductivity of the metallic (in particular copper) material of the leadframe. A leadframe may comprise for instance aluminum and/or copper. In the context of the present application, the term "die pad" may particularly denote a portion of a leadframe being shaped and dimensioned for accommodating an electronic component such as a semiconductor chip. Correspondingly, the surface area of the die pad is usually flat and planar and sufficiently large for fully receiving the chip or die thereon. In contrast to this, the term "leads" may particularly denote another portion of a leadframe which may at least partially extend beyond an encapsulant (if present) and serves as connection element to an electronic periphery of the package. It is for instance possible that one or more terminals of the electronic component mounted on the die pad is or are electrically connected to a respective one of the leads, for instance by a clip, bond wire or bond ribbon. It is for instance possible that the die pad is encapsulated and the leads are partially or entirely exposed with regard to an encapsulant. It is also possible that the die pad forms a central portion of a leadframe type carrier, whereas the leads may form a peripheral portion of the leadframe. Both die pads and leads may at least partially comprise a metallic material. More generally, the carrier may be a partially or entirely metallic structure.

However, many different carriers may be used with different embodiments, and the described leadframe is just an example for an advantageously usable carrier.

In an embodiment, the method comprises temporarily connecting a support plate to the sheet before mounting the electronic components in the mounting section. For instance, such a support plate may be made of plastic, ceramic or a sufficiently thick metal so as to properly support the continuous sheet during the assembly of the electronic components and during encapsulation. After having fulfilled this support function and after having completed encapsulation, the temporary support plate may be again removed from the structure because the completion of the encapsulation has rendered the structure even without temporary support plate sufficiently robust. The temporary support plate may then be reused or recycled for a further manufacturing process or may be disposed. Using certain optional support plate also allows using very thin sheets, for instance copper foils. This renders the readily manufactured packages compact and light-weight.

In an embodiment, the method comprises forming blind holes in the sheet and subsequently mounting the electronic components in the blind holes. By forming blind holes (for instance by half etching the continuous sheet), accommodation volumes for accommodating the electronic components may be formed. On the one hand, this simplifies the assembly process of the electronic components and ensures that the electronic components are assembled and remain specifically at a desired location. On the other hand, this also ensures that packages with a very thin vertical dimension can be manufactured in a compact way.

In the alternative embodiment, the mounting surface of the sheet at which the electronic components are mounted may be planar or non-patterned (rather than having blind holes). With such a planar or non-patterned mounting surface of the sheet, electronic components may be mounted freely at desired surface regions of the mounting surface without any limitation.

In an embodiment, the method comprises connecting at least part of the sheet with a profiled structure and subsequently structuring at least part of the sheet using the connected profiled structure as mask. Preferably, the profiled structure may be a leadframe structure (alternatively, a clip frame may be used as mask). In particular, it may be possible that a metallic sheet of continuous thickness is connected to an already preformed profiled structure before mounting the electronic components on such a sheet with attached profiled structure. During singularizing the various carriers from the previously integral sheet-profiled structure-arrangement, it may then be possible to back-etch or mechanically grind the composite sheet so that the singularization occurs exclusively defined by the shape of the profiled structure. It is also possible to connect a separate leadframe after having patterned the sheet.

In an embodiment, the method comprises connecting structured parts of the sheet with a profiled structure. Distances on the profiled structure (in particular leadframe structure) and distances on the sheet are not necessarily identical. Thus, it is possible that the sheet is divided into separate preforms or parts prior to the connection with the profiled structure. Thus, the preforms can be electrically connected with the profiled structure and can be patterned using the profiled structure (in particularly leadframe structure) as a mask.

In an embodiment, the method comprises singularizing (for instance by cutting, etching or laser processing) the structure obtained after patterning into separate packages, each comprising one of the carriers, at least one of the electronic components, at least one of the interconnect structures, and part of encapsulant. In particular, the method may comprise singularizing the structure by removing material of the encapsulant without removing material of the sheet. According to such an advantageous embodiment, separation occurs only by removing relatively soft material of the encapsulant, whereas singularization does not require to remove metallic material of the already patterned sheet. This renders the procedure of singularizing the obtained structure into separate packages particularly simple and failure-robust.

In an embodiment, the sheet has a thickness in a range between 30 μm and 3 mm, in particular in a range between 200 μm and 500 μm. Thus, the thickness of the sheet may vary over a broad range. It covers for instance copper foils (which may optionally be connected with a support plate during part of the manufacturing process to provide additional support) as well as rigid copper plates (for which a support plate may not be needed and may thus be completely optional).

In an embodiment, the sheet has a constant thickness. Such a sheet may have two planar opposing main surfaces. Providing the sheet with a constant thickness allows to use a very simple and cheap raw material for manufacturing the packages without compromising on carrier performance.

In another embodiment, the sheet has a planar first main surface and an opposing second main surface having a surface profile. In such an embodiment, the surface profile of the sheet may already define an outline of the later formed carriers because material of the sheet can simply be removed using the surface profile as a mask.

In an embodiment, the interconnect structures are selected from a group consisting of clips, bond wires, and bond ribbons. A clip may be a three-dimensionally bent plate type connection element which has two planar sections to be connected to an upper main surface of the respective electronic component and an upper main surface of the carrier, wherein the two mentioned planar sections are interconnected by a slanted or vertical connection section. As an alternative to such a clip, it is possible to use a wire bond or ribbon bond which is a flexible electrically conductive wire or ribbon shaped body having one end portion connected to the upper main surface of the respective electronic component and having an opposing other end portion being electrically connected to the carrier.

In an embodiment, at least two opposing, in particular all four, laterally outmost sidewalls or laterally outmost sidewall portions of the package are exclusively formed by material of the encapsulant. This is the result of the separation of the individual package by cutting through encapsulant material only after having correspondingly patterned the sheet.

In an embodiment, the at least one electronic component experiences a vertical current flow during operation. The package architecture according to exemplary embodiments is particularly appropriate for high power applications in which a vertical current flow is desired, i.e. a current flow in a direction perpendicular to the two opposing main surfaces of the electronic component, one of which being used for mounting the electronic component on the sheet and the other one being used for connecting the electronic component with the interconnect structure.

In an embodiment, substantially the entire lower main surface of the at least one electronic component is fully in contact, in particular is fully in electric contact, with the carrier. In other words, the entire area of the lower main surface of the respective electronic component may be completely in contact with an upper main surface of the sheet or carrier (in particular only separated by a connection medium such as solder, adhesive, etc.). This allows for a proper mechanical or even electric coupling between electronic component and sheet/carrier.

In an embodiment, the at least one electronic component comprises at least one first electric terminal at the upper main surface and comprises at least one second electric terminal at the lower main surface. For instance, the electric terminals may be chip pads. When the electronic component is a transistor chip, a drain terminal may be arranged at the lower main surface, and source and gate terminals may be arranged at the upper main surface (or vice versa).

In an embodiment, the encapsulant comprises or consists of a mold component. When encapsulating by molding, injection molding or transfer molding may be carried out, for example. Hence, the encapsulant may comprise a mold, in particular a plastic mold. For instance, a correspondingly encapsulated body (in particular electronic component with carrier) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties. Other encapsulant material may be used as well.

In an embodiment, the electronic component is mounted on the mounting region by at least one of the group consisting of a solder structure, a sinter structure, or a welding structure. Also adhesively mounting the electronic component on the mounting region is possible.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the Figures, some general considerations will be summarized based on which exemplary embodiments have been developed.

According to an exemplary embodiment, panel packaging may be carried out starting with an at least substantially and in particular entirely continuous sheet as unstructured preform of leadframes. Only after mounting of electronic components on the continuous sheet and after forming interconnect structures and/or after encapsulation from a front side, the sheet may be structured from a back side (i.e. from a side opposing the electronic components) to thereby form, based on the sheet, separate carriers for individual packages.

Packaging on panel level allows obtaining low packaging effort due to the large substrate size in combination with parallel processing. Also, the capacity of a panel line may be very high. In order to fill the line, high flexibility in packaging flows for multiple package platforms may be desired.

An exemplary embodiment provides a manufacturing architecture for flexible panel based packaging. More specifically, an exemplary embodiment starts the manufacture of packages (in particular leadless power packages or logic packages) with an unstructured sheet (for instance made of copper). The thickness of such a sheet may be preferably in a range between 200 µm and 500 µm, but may also be larger or smaller. Advantageously, the assembly of electronic components (in particular a die attach, for instance by solder, adhesive, sinter paste, diffusion solder, etc.) and/or first level interconnects (for example thin bond wires, thick bond wires and/or a clip) may be provided on the unstructured sheet as well. The obtained preform of multiple still integrally connected packages may then be encapsulated (for instance molded, for example by compression molding). Structuring of the continuous sheet may then be done after the application of first level interconnect and/or encapsulation or housing (for instance by molding). Structuring or patterning of such a continuous sheet can be done for example by etching or mechanically (for instance by grinding and/or milling).

Advantageously, such a manufacturing concept enables the manufacture of multiple packages with low effort by processing them over a significant part of the manufacturing process on panel format. Moreover, no customized leadframes are required for such a manufacturing process according to an exemplary embodiment, since starting point may be a full electrically conductive sheet, such as a copper sheet. Also a pre-package architecture is possible in some embodiments. Obtained packages may show a high reliability since electrically conductive material (such as copper) of the sheet may extend from encapsulant (for instance mold body) for SMD (surface mounted devices) type attach. Furthermore, a fast dicing or singulation process of the panel into the individual packages is possible, since only encapsulant material (such as a mold compound) has to be separated, whereas cutting or dicing through metallic sheet material (in particular copper) may be dispensable. Some embodiments may also be compatible with electronic components experiencing vertical current flow, for instance for high-power applications. Moreover, a full area connection of electronic components (in particular electronic chips, such as bare dies) and carrier (in particular leadframe) may be possible which may provide an excellent thermal conductivity. Also the formation of peripheral leads without or with redistribution layer may be possible.

In a manufacturing method of exemplary embodiments, the thickness of the continuous sheet (which may be a copper foil or copper plate) can be chosen. The sheet is only later structured in a subtractive way, for instance by removal of copper where not required or desired. A mask for structuring can be an etch resist.

The unstructured or continuous sheet can be separated into parts, and these parts can be attached to stamped leadframes or other profiled structures, for instance by welding, soldering, gluing, diffusion soldering (in particular with pre-package technique). After attachment of the pre-package, the sheet may be etched with the leadframe or other profiled structure serving as a mask. This way, also very thick leadframe packages can be achieved. The bottom side with the copper structures can be overprinted or plated in order to embed the copper terminals for better adhesion. Also a solder stop can be used.

Anchoring structures for copper can be foreseen, for instance if the sheet is structured from its top side. The sheet can be structured for example by half-etch (in particular on its top side) with die paddle(s) and leads. The die or other kind of electronic component may be attached, and the first level interconnects may be provided. After encapsulation (in particular molding), the bottom side of the panel may be grinded to release the separation of the die paddle and the leads. Those are now completely embedded in mold compound.

FIG. 1 illustrates a block diagram of a method of manufacturing packages 100 according to an exemplary embodiment. As indicated by a block 200, the method comprises providing an electrically conductive continuous sheet 102. Thereafter and as illustrated by block 210, the method further comprises mounting a plurality of electronic components 104 on the sheet 102. Subsequently, interconnect structures 106 are formed for electrically coupling the electronic components 104 with the sheet 102 (compare block 220). After said forming, the sheet 102 is structured, as indicated by block 230.

Figure 2:
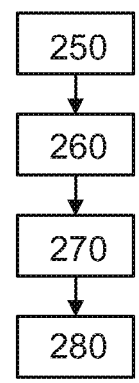
FIG. 2 illustrates a block diagram of a method of manufacturing packages according to another exemplary embodiment.

FIG. 2 illustrates a block diagram of a method of manufacturing packages 100 according to another exemplary embodiment. Referring to a block 250, the method comprises providing an electrically conductive continuous sheet 102. As shown by block 260, the method comprises mounting a plurality of electronic components 104 on the sheet 102. Thereafter, the electronic components 104 are at least partially encapsulated by an encapsulant 108, compare block 270. After the encapsulating, the sheet 102 is patterned to thereby form individual carriers 110 for each package 100 (see block 280).

FIG. 3 to FIG. 13 illustrate structures obtained during carrying out a method of manufacturing packages 100 according to another exemplary embodiment. Said figures show an exemplary process flow which may be carried out with three interconnect options, i.e. three different possibilities of forming interconnect structures 106 as different embodiments. Those can be combined, if desired. The mentioned embodiments relate to interconnect structures 106 embodied as thick wires with thin gate wire (which may be used for example for power packages), packages 100 with clips (clip frame), or a clip and one thin wire bond for gate contact (appropriate for power packages as well) or multiple thin wires (for instance for VQFN or logic packages). In some of FIG. 3 to FIG. 13, different views are shown (such as a plan view and a three-dimensional view, as in FIG. 3, or an overview and a detailed view, as in FIG. 7).

Figure 3:
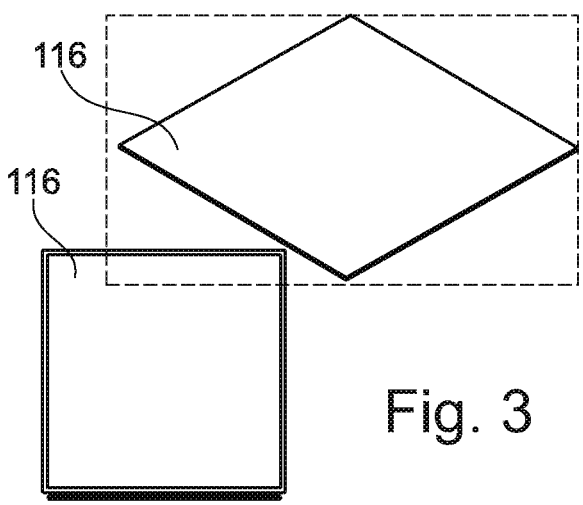
FIG. 3 to FIG. 13 illustrate structures obtained during carrying out a method of manufacturing packages according to another exemplary embodiment.

Referring to FIG. 3, a support plate 116 is shown which may be temporarily connected to below described sheet 102 before mounting electronic components 104 and which may be removed from the processed sheet 102 prior to patterning of the sheet 102. For instance, the support plate 116 may be made of steel, a polymer, an alloy, aluminum, or silver. It is also possible that the support plate 116 is already connected with the sheet 102 at the beginning of the processing. To simplify handling, the support plate 116 may also be provided with a handle (not shown). After use, the support plate 116 may be recycled for the next manufacturing batch or may be disposed. The temporary support plate 116 shown in FIG. 3 may be shaped as a plate, for instance a rectangular plate, for example having a dimension of 620×620 mm².

Figure 4:
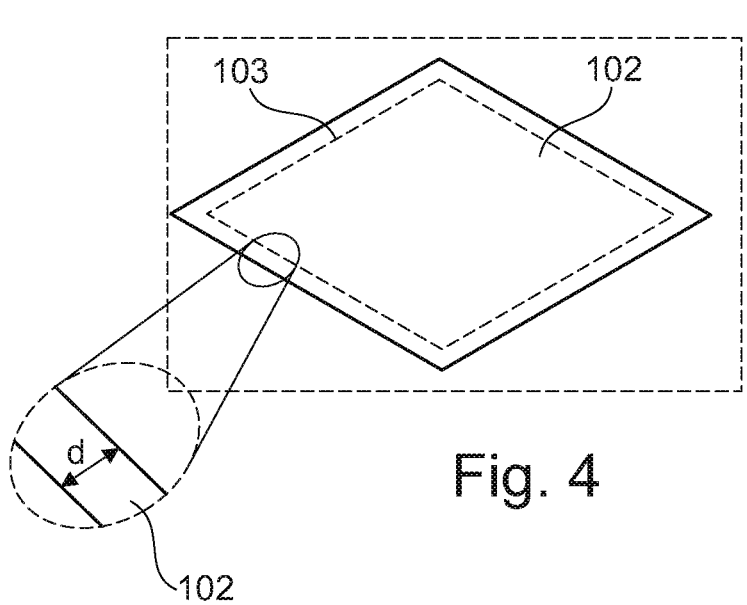

Referring to FIG. 4, electrically conductive continuous sheet 102 it is shown which is to be mounted on the optional support plate 116. Alternatively, sheet 102 can also be further processed as described below without attachment to a support plate 116.

As indicated schematically with broken lines in FIG. 4, a central portion of the sheet 102 (which central portion may correspond to for example at least 90% of the area of the upper main surface of the sheet 102) serves as mounting region 103 on which later electronic components 104 are mounted (compare FIG. 6). At least said mounting region 103 is continuous without through holes. Although not shown, a peripheral portion of sheet 102 outside of the mounting region 103 may comprise one or more alignment features for aligning the sheet 102 and/or one or more handling features for handling the sheet 102.

Preferably, the sheet 102 may be provided with a constant thickness, d, in a range between 200 µm and 500 µm. However and more generally, the sheet 102 may be configured with a thickness, d, of 100 µm, 200 µm, 250 µm, 1 mm or 2.54 mm. For example, the sheet 102 may comprise or consist of copper. To simplify handling, the dimensions of the sheet 102 may be slightly smaller than the dimensions of the temporary support plate 116, for example may be 610×610 mm².

Figure 5:
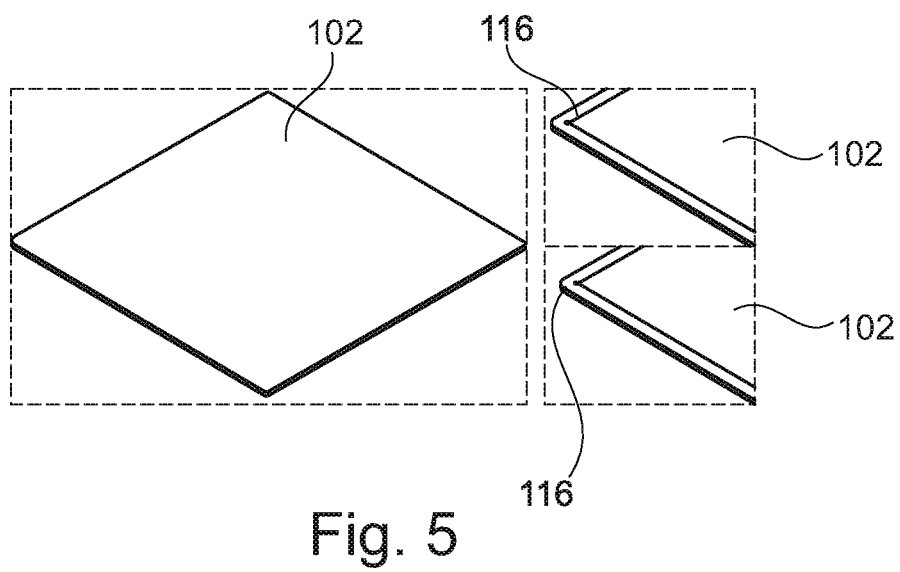

As can be taken from FIG. 5, the copper sheet 102 is placed on the temporary support plate 116 so as to obtain a temporary composite structure providing strong mechanical support.

Figure 6:
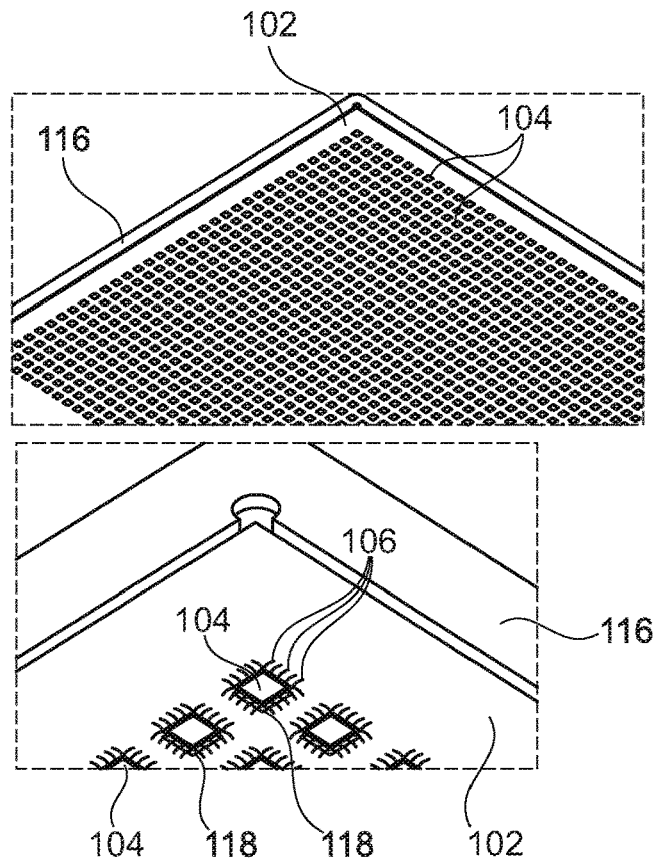

Referring to FIG. 6, blind holes 118 may be optionally formed in the sheet 102 to define accommodation volumes for electronic components 104. Subsequently, the electronic components 104 may be mounted in the blind holes 118. However, it is alternatively also possible that the electronic components 104 are mounted directly on a planar surface of the sheet 102 in the mounting region 103, i.e. without providing blind holes 118. Mounting may be accomplished for instance by soldering, sintering, adhering (preferably with an electrically conductive adhesive) or welding.

In the shown embodiment, the electronic components 104 are power semiconductor chips having a MOSFET (metal oxide semiconductor field effect transistor) as integrated circuit. During operation, the electronic components 104 may experience a vertical current flow, i.e. a flow of electric current along a direction being substantially perpendicular to the main surface of the sheet 102 on which the electronic components 104 are mounted. Such electronic components 104 may have pads or terminals on both opposing main surfaces, i.e. on a bottom main surface on which the electronic components 104 are connected with the sheet 102 and on a top main surface facing away from the sheet 102. For instance, a drain pad may be formed on substantially the entire lower main surface, and a gate pad and a source pad may be formed on the upper main surface of the respective electronic component 104. In view of the large area of the drain pad, the entire lower main surfaces of the electronic components 104 are substantially fully in electrically conductive contact with the sheet 102.

After mounting of the electronic components 104 on the sheet 102, interconnect structures 106 may be connected for establishing an electric coupling between the pads on the upper main surfaces of the electronic components 104 with the upper main surface of the sheet 102, which upper main surface carry the electronic components 104. In other words, the electrically conductive interconnect structures 106 electrically connect the upper main surfaces of the electronic components 104 with the sheet 102 on which lower main surfaces of the electronic components 104 are mounted. According to FIG. 6, the interconnect structures 106 are configured as bond wires.

Thus, as can be taken from FIG. 6, one or more dies are attached as electronic components 104 to the blind holes 118 in the copper sheet 102 by an appropriate die attach method, for instance soldering, gluing, sintering or diffusion soldering. The distance between adjacent electronic components 104 may be freely chosen. After die attach, the electronic components 106 may be wire bonded, wherein the wires may be connected at freely definable positions on the copper sheet 102. Alternatively, a clip attach may be carried out. The wire bonds can be made of gold, aluminum or copper wires with different thicknesses. For instance, the die placement index may be 4.2 mm×4.2 mm.

Figure 7:
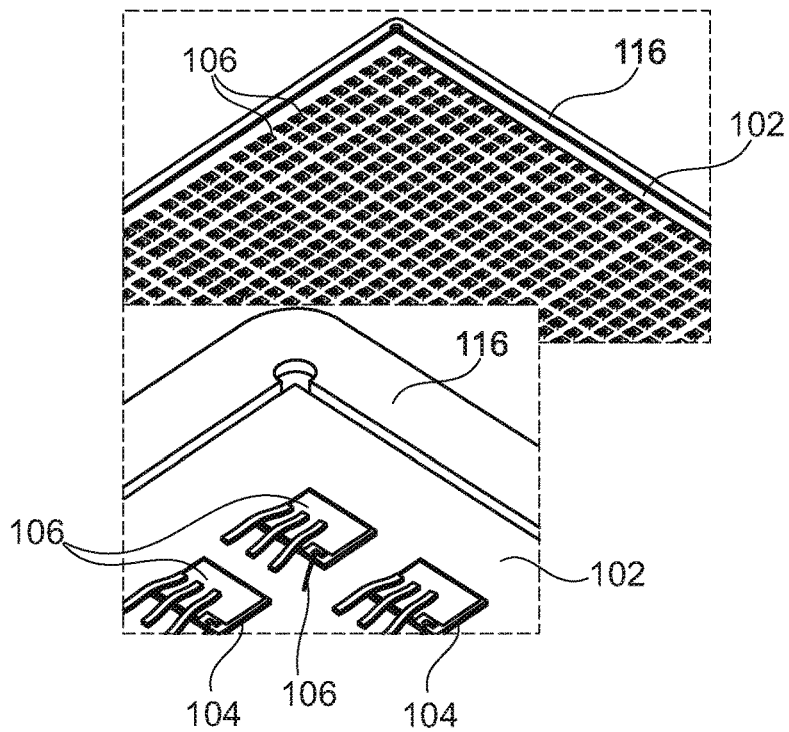

FIG. 7 shows an alternative way of forming interconnect structures 106 for electrically coupling the electronic components 104 with the sheet 102. According to FIG. 7, some of the interconnect structures 106 are configured as bond wires or bond ribbons being thicker than the ones of FIG. 6. More precisely, thick wires may be used as interconnect structures 106 for power applications, and thin wires as further interconnect structures 106 may be used for a gate bond according to FIG. 7. The wire connections may be bonded on freely chosen positions on the copper sheet 102.

Figure 8:
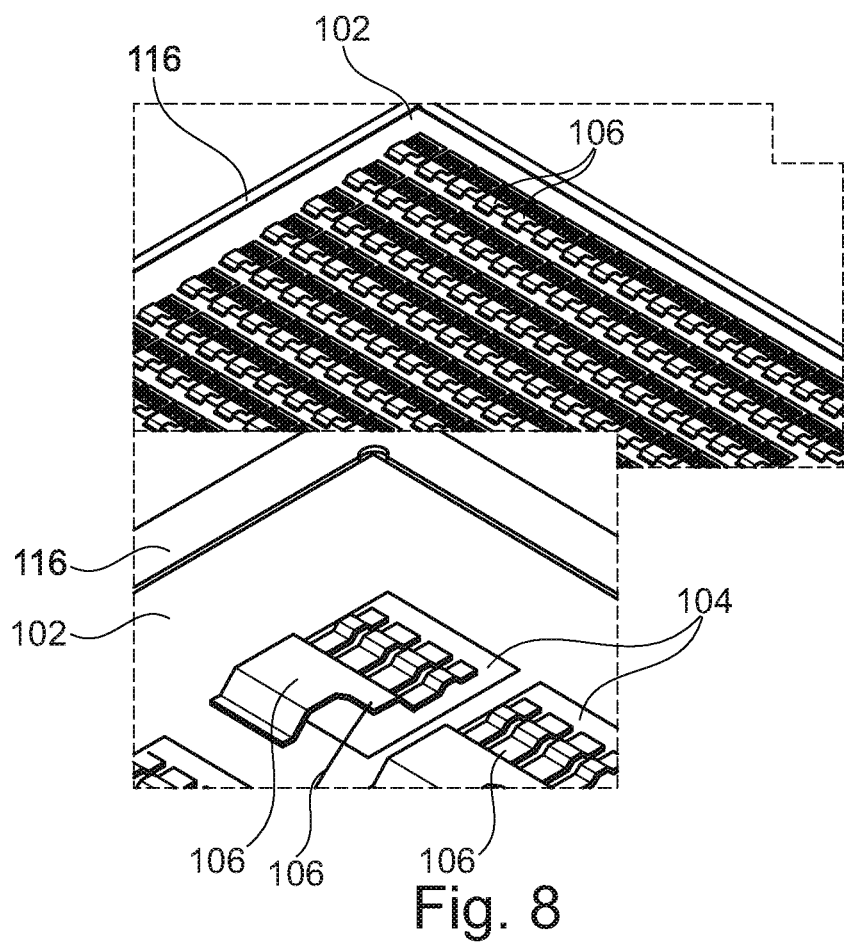

FIG. 8 illustrates a third possible embodiment for the attachment of interconnect structures 106, which are now embodied as clips. In this embodiment, the electronic components 104 may be placed into solder, solder paste may be applied onto the electronic component 104 and the clip or clip frame, as interconnect structure 106, may be attached and connected by reflow soldering. FIG. 8 shows a clip frame with a placement index of 20.5 mm×13.5 mm. A single slot is indicated with a clip as interconnect structure 106. One wire bond for the gate contact is provided as further interconnect structure 106.

Figure 9:
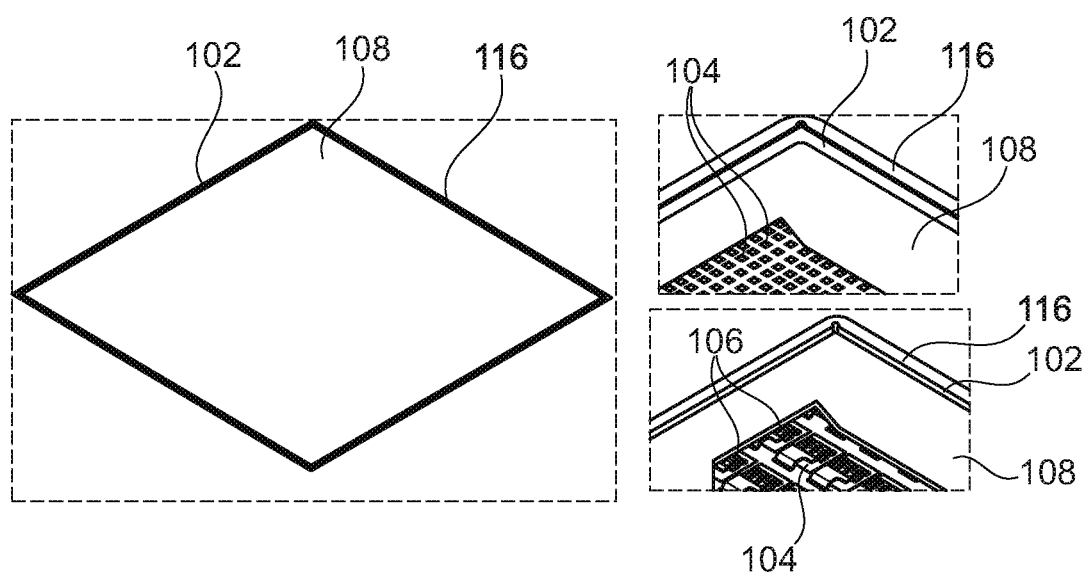

Referring to FIG. 9, the electronic components 104 and the interconnect structures 106 may be partially or entirely encapsulated by an encapsulant 108, such as a mold compound formed by molding. The encapsulant 106 also covers still exposed surface portions on an upper main surface of the sheet 102. After curing the mold compound, the temporary support plate 116 may be removed, since it is no longer needed for structural stability.

Thus, the attached electronic components 104 and interconnect structures 106 may be embedded in mold compound, as encapsulant 108, on the copper sheet 102. Formation of the encapsulant 106 may be carried out, for instance by overmolding or overprinting, from a front side. For instance, compression molding can be used for this purpose.

Before encapsulation, an adhesion promoting process can be performed (if desired or required for increasing the adhesion of the mold compound type encapsulant 108 to the material of the electronic components 104 and/or of the sheet 102).

Figure 10:
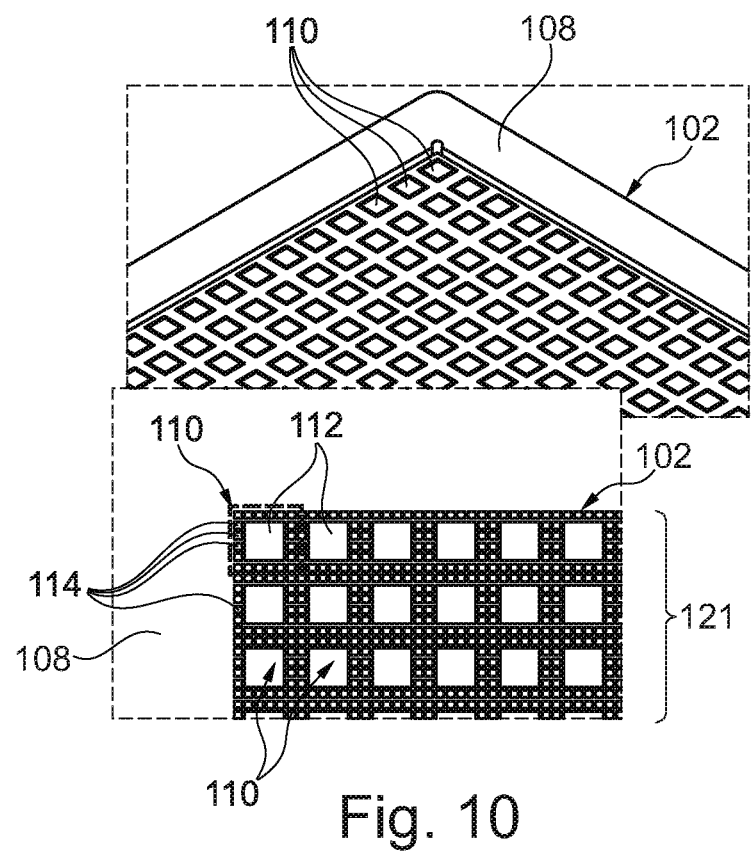

Referring to FIG. 10, the sheet 102 may then be structured or patterned from a back side opposing said front side. Structuring of the sheet 102 may be accomplished after the encapsulation and after removal of the temporary support plate 116 to thereby form individual carriers 110 for each package 100. The carriers 110 are thus obtained by patterning the previously continued sheet 102. In the embodiment of FIG. 10, the sheet 102 is structured into a leadframe structure 121 in such a way that each of the carriers 110 comprises a central die pad 112 and a plurality of leads 114 circumferentially surrounding the die pad 112 in the shown embodiment. By this patterning or structuring from a back side after prior encapsulation with the encapsulant 108 on a front side, individual leadframe type carriers 110 may thus be created for each package 100. In other words, structuring the sheet 102 forms the leadframe structure 121 based on the previously continued sheet 102.

Hence, as shown in FIG. 10, the molded copper sheet 102 may be removed from the temporary support plate 116. The sheet 102 may be subtractly structured at a back main surface opposing a front main surface on which the electronic components 104 have been mounted, the interconnect structures 106 have been connected and the encapsulant 108 has been formed. For patterning, a resist can be applied, a lithography procedure can be carried out (for opening areas of copper which shall be removed in an etch process), and the copper sheet 102 may be etched away at positions where no copper is wished. Die paddle or die pad 112 and leads 114 of a respective leadless package can be created in this way.

Due to patterning or structuring of previously continuous sheet 102 only after encapsulation, sub-structures of the obtained carriers 110 may have small gaps in between being not filled with encapsulant 108, but being filled with air (see FIG. 14 to FIG. 23 and FIG. 26).

Figure 11:
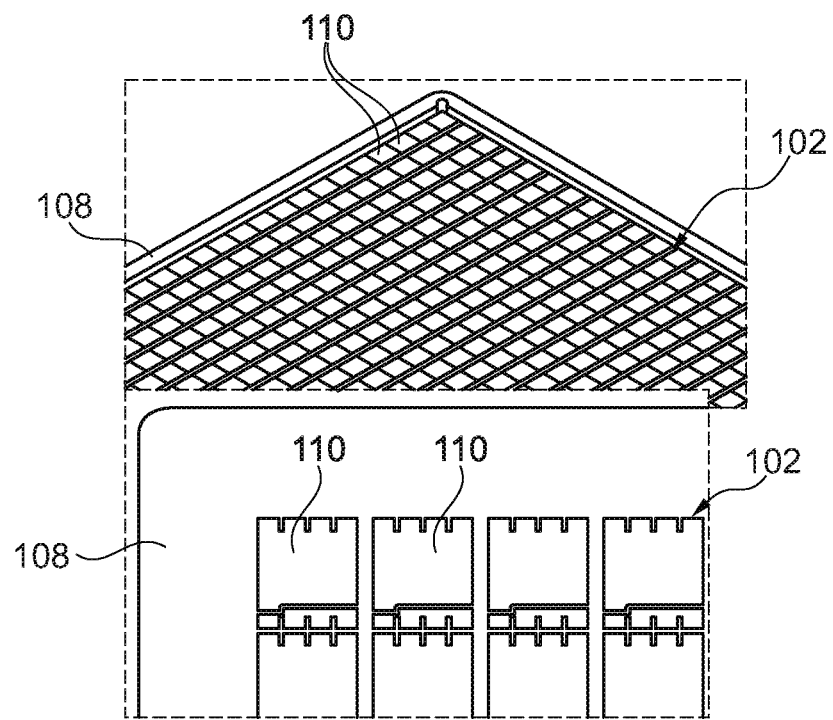

Referring to FIG. 11, different copper structures (as compared to FIG. 10) can be realized when structuring the sheet 102 into separate carriers 110. The applied design rules may be selected depending on the thickness, d, of the copper sheet 102 (in order to obtain a desired aspect ratio). According to FIG. 11, individual carriers 110 with a different configuration than in FIG. 10 are obtained.

Figure 12:
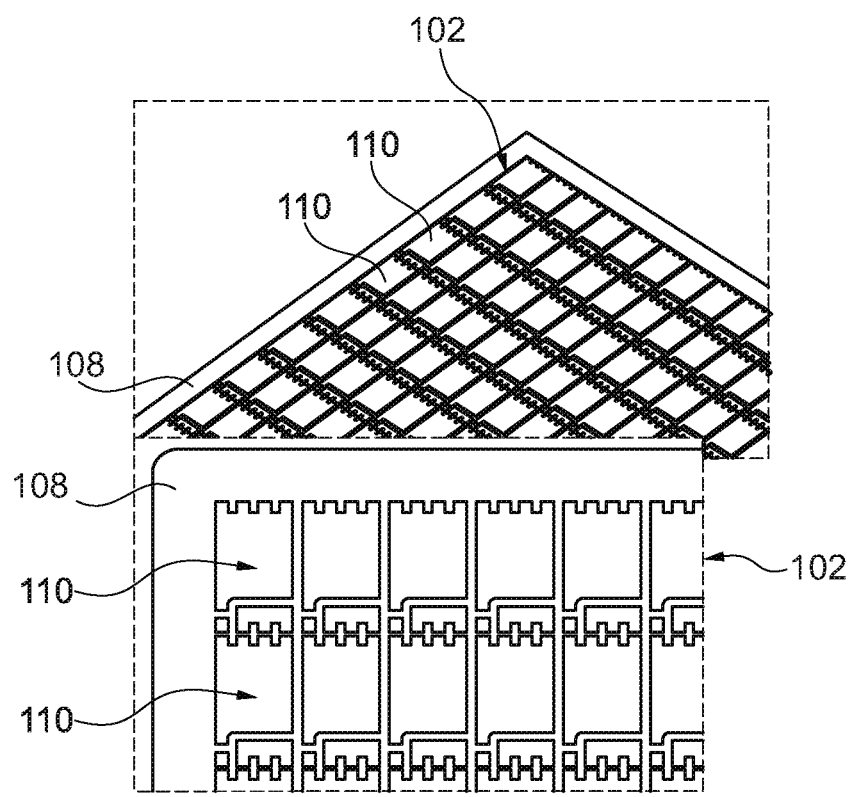

FIG. 12 shows a further embodiment for structuring the copper sheet 102 in order to generate a pad out geometry of the obtained carriers 110. Thus, according to FIG. 12, individual carriers 110 with yet another configuration than in FIG. 10 and FIG. 11 are obtained.

Subsequently, further processes for pad finish, etc., can be applied, such as galvanic plating, electroless plating, solder resist, bumping or ball apply.

Figure 13:
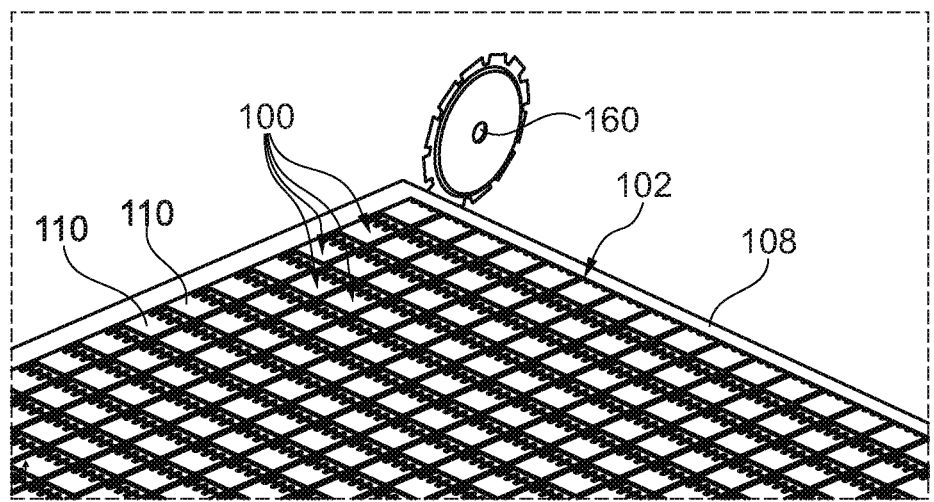

Referring to FIG. 13, the structure obtained after structuring sheet 102 into separate carriers 110 (as shown in FIG. 10 to FIG. 12) may be separated or singularized into separate packages 100. This may be accomplished for instance by a cutting blade 160, by etching or by laser processing. Each separated package 100 comprises one of the carriers 110, one more of the electronic components 104, one more of the interconnect structures 106, and a portion of the encapsulant 108.

Advantageously, the process of singularizing the structure may be carried out exclusively by removing material of the encapsulant 108 without removing material of the now already patterned sheet 102 or of the interconnect structures 106. This is advantageous, since it allows to cut through simply cuttable material such as mold compound rather than cutting through a metallic material such as copper. As a result, outermost sidewalls of the obtained packages 100 may be exclusively formed by material of the encapsulant 108 (see FIG. 14 to FIG. 23 and FIG. 26).

For instance, separation of the structure into individual packages 100 can be done by laser, water-cutting, milling, stamping or silicon blade dicing-separation processes.

Referring to FIG. 14 to FIG. 23, packages 100 according to exemplary embodiments are illustrated. Those packages 100 can be obtained by a manufacturing process as the one described above referring to FIG. 3 to FIG. 13.

FIG. 14 and FIG. 15 show different views of a package 100 manufactured by such a method.

The illustrated package 100 comprises a leadframe type carrier 110 obtained by the above-described patterning of sheet 102 and being structured into a plurality of substructures 140 spaced by respective air gaps 142. In other words, the gaps 142 may be filled with air. The air gaps 142 being free of solid material and in particular being free of encapsulant material are obtained, since the above-described patterning or structuring of sheet 102 into separate carriers 110 forming the gaps 142 is carried out after forming encapsulant 108.

One more electronic components 104, such as power semiconductor chips with vertical current flow, may be mounted with a lower main surface on the carrier 110. One or more interconnect structures 106, here embodied as clips, electrically connect an upper main surface of the electronic component 104 with an upper main surface of the carrier 110. The encapsulant 108 thus encapsulates the electronic component 104, the interconnect structure 106 and the carrier 110. The back main surface of the carrier 110 and the gaps 142 between the sub-structures 114 remain non-encapsulated and exposed to the environment of the package 100. As furthermore shown in FIG. 14 and FIG. 15, opposing laterally outmost sidewall portions 144 of the package 100 may be exclusively formed by material of the encapsulant 108, not by copper material.

The package 100 shown in FIG. 14 has dimensions of 4.1×4.1×0.7 mm³. FIG. 15 provides the example of a leadframe thickness, d, of 0.1 mm.

FIG. 16 and FIG. 17 show different views of a package 100 manufactured by a method according to another exemplary embodiment. In the embodiment of FIG. 16, the dimensions are 8×8×1.2 mm³. In the example of FIG. 17, the leadframe thickness, d, may be 0.2 mm.

FIG. 18 and FIG. 19 show different views of a package 100 manufactured by a method according to an exemplary embodiment. In the embodiment of FIG. 18, the package 100 has dimensions of 20×13×3.5 mm³. In the example of FIG. 19, the leadframe thickness, d, may be 1 mm.

FIG. 20, FIG. 21, FIG. 22 and FIG. 23 show different views of packages 100 manufactured by a method according to an exemplary embodiment. The dimensions of the packages 100 may be 20×13×2.9 mm³. Portions of the interior of the package 100 are exposed in FIG. 20. The leadframe thickness in FIG. 23 may be 1 mm.

Figure 24:
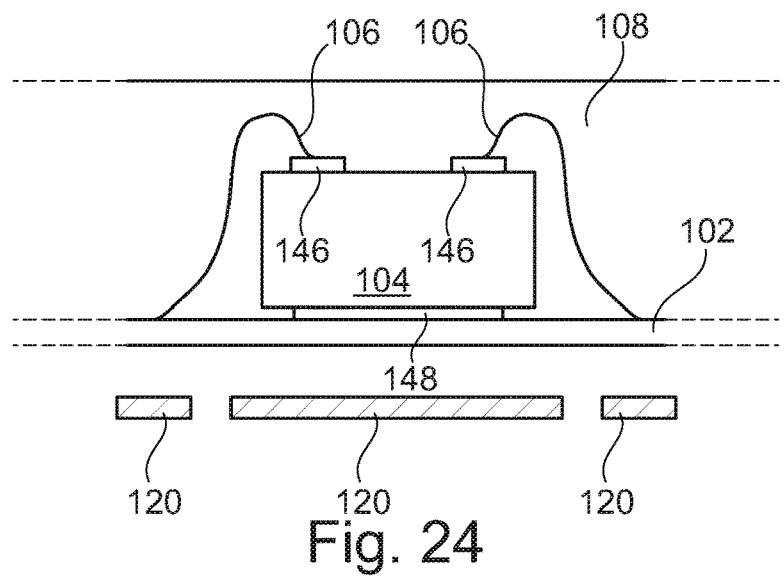
FIG. 24 to FIG. 26 illustrate structures obtained during carrying out a method of manufacturing packages according to another exemplary embodiment.
Figure 25:
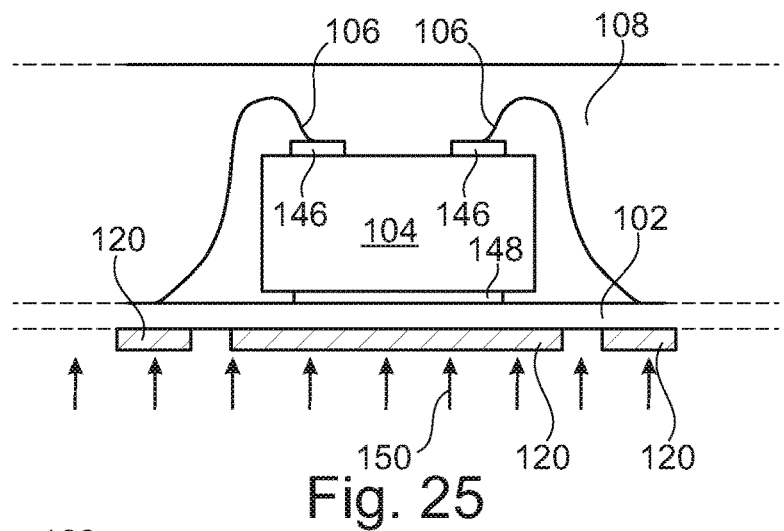
Figure 26:
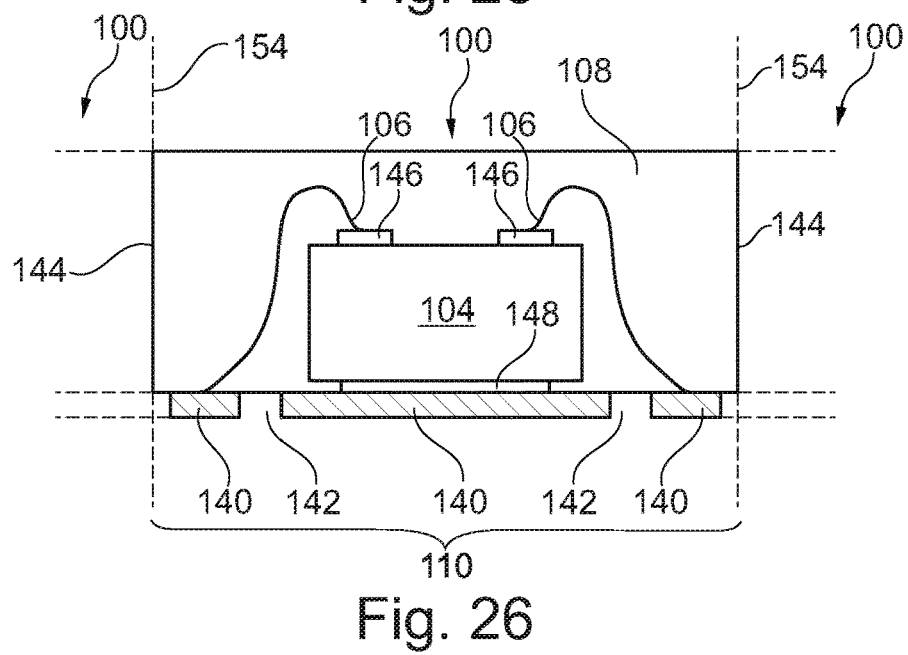

FIG. 24 to FIG. 26 illustrate structures obtained during carrying out a method of manufacturing packages 100 according to another exemplary embodiment. The structures shown in FIG. 24 to FIG. 26 are obtained during a batch manufacture of multiple packages 100 simultaneously and based on the same continuous sheet 102, encapsulant 108, etc. For the sake of simplicity, FIG. 24 to FIG. 26 only show constituents of one package 100. The presence of other packages 100 and preforms thereof is indicated by broken lines.

Referring to FIG. 24, a semifinished product is shown which comprises electrically conductive continuous sheet 102 (for example a continuous copper plate), electronic components 104 configured as power semiconductor chips experiencing vertical current flow, bond wire type interconnect structures 106 and a mold type encapsulant 108. Furthermore, a separate profiled structure 120 (for instance a leadframe structure, such as the one shown with reference numeral 121 in FIG. 10, for example made of copper) is shown as well. More specifically, the transistor chip type electronic components 102 comprise two first electric terminals 146 (in particular a source pad and a gate pad) at the upper main surface and comprise a second electric terminal 148 (in particular a drain pad) at the lower main surface.

As shown, the profiled structure 120 is still separate from the integral body composed of electronic components 104, sheet 102, interconnect structures 106, and encapsulant 108.

Referring to FIG. 25, the integral body comprising the sheet 102 is connected with the previously separate profiled structure 120, so as to form one common integral structure. More specifically, the exposed surface of the sheet 102 being not covered with encapsulant 108 is connected with the corresponding main surface of the profiled structure 120. Thus, the profiled structure 120 can be connected (for instance by soldering) to a lower main surface of the sheet 102, so as to form an integral structure. As shown in FIG. 25, the connected double layer composed of the sheet 102 and the profiled structure 120 has an upper planar first main surface on which the electronic components 104 are mounted and has a lower opposing second main surface having a surface profile. Said surface profile corresponds to the pre-structured shape of the profiled structure 120.

After having obtained said integral structure, the composite double layer composed of sheet 102 and profiled structure 120 can be patterned or structured together. During this patterning or structuring procedure, the pre-shaped profiled structure 120 functions as mask for defining portions of the sheet 102 which will be removed during the patterning or structuring procedure. Portions of the sheet 102 covered with the pre-shaped profiled structure 120 will not be removed during this patterning or structuring procedure, whereas exposed portions of the sheet 102 will be removed as well as exposed portions of the profiled structure 120. For instance, this patterning or structuring may be carried out by etching, as indicated schematically by reference numeral 150.

Referring to FIG. 26, as a result of the etching, exposed material of the sheet 102 and of the profiled structure 120 has been removed so that a carrier 110 is obtained which has the shape of the profiled structure 120 and is made at least partially of material of the sheet 102.

The shown structure of FIG. 26 may be separated along separation lines 154 into separate packages 100.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing packages, wherein the method comprises:
   providing an electrically conductive sheet having two planar opposing main surfaces being continuous at least in a mounting region;
   mounting first main surfaces of a plurality of electronic components on an exposed first one of the two planar main surfaces in the continuous mounting region of the sheet;
   forming interconnect structures for directly electrically coupling second main surfaces of the electronic components with the first one of the two planar main surfaces of the sheet, wherein the second main surfaces of the electronic components oppose the first main surfaces of the electronic components;
   at least partially encapsulating the electronic components and the interconnect structures by an encapsulant;
   after the encapsulating, structuring the sheet; and
   singularizing a structure, obtained after structuring the sheet, into separate packages by removing material of the encapsulant without removing material of the sheet.

2. The method according to claim 1, wherein the method comprises structuring the sheet to thereby form individual carriers for each package.

3. The method according to claim 2, wherein each package comprises one of the carriers, at least one of the electronic components, and at least one of the interconnect structures.

4. The method according to claim 1, wherein the method comprises structuring the sheet to thereby form a leadframe structure.

5. The method according to claim 1, wherein the method comprises connecting at least a part of the sheet with a profiled structure and subsequently structuring at least part of the sheet using the profiled structure as mask.

6. The method according to claim 1, wherein the sheet has a thickness in a range between 30 μm and 3 mm.

7. A method of manufacturing packages, wherein the method comprises:
   providing an electrically conductive substantially continuous sheet having two planar opposing main surfaces;
   mounting a plurality of electronic components, having a vertical current flow through the electronic component during operation such that current flows through a lower main surface and an upper main surface of the electronic component, on a first one of the two planar main surfaces of the sheet;
   at least partially encapsulating the electronic components by an encapsulant; and
   after the encapsulating, patterning the sheet from a non-encapsulated back side of the sheet to thereby form individual carriers for each package.

8. The method according to claim 7, wherein the method comprises forming, before patterning and in particular before at least partially encapsulating the electronic components, interconnect structures for electrically coupling upper main surfaces of the electronic components with the sheet on which lower main surfaces of the electronic components are mounted.

9. The method according to claim 7, wherein the method comprises singularizing a structure, obtained after patterning the sheet, into separate packages, each at least comprising one of the carriers, at least one of the electronic components, and a portion of the encapsulant.

10. The method according to claim 9, wherein the method comprises singularizing the structure by removing material of the encapsulant without removing material of the sheet.

11. The method of claim 1, wherein each electronic component of the plurality of electronic components experiences a vertical current flow through the electronic component during operation such that current flows through the first main surface and the second main surface of the electronic component.

12. The method of claim 1, wherein the sheet comprises a constant thickness.

13. The method of claim 1, wherein the electrically conductive sheet is a single layered sheet.

14. The method of claim 1, wherein structuring the sheet comprises subtractly structuring the sheet at a second one of the two planar main surfaces.

15. A package, comprises:
   a carrier having two planar opposing main surfaces structured into a plurality of sub-structures spaced by at least one gap;
   at least one electronic component mounted with its lower main surface on the carrier;
   at least one interconnect structure electrically coupling an upper main surface of the at least one electronic component with the carrier; and
   an encapsulant at least partially encapsulating the at least one electronic component and partially encapsulating the carrier in such a way that the at least one gap is non-encapsulated,
   wherein the at least one electronic component experiences a vertical current flow through the at least one electronic component during operation such that current flows through the lower main surface and the upper main surface of the at least one electronic component.

16. The package according to claim 15, wherein at least two opposing, laterally outmost sidewall portions of the package are exclusively formed by material of the encapsulant.

17. The package according to claim 15, wherein substantially the entire lower main surface of the at least one electronic component is fully in electrically conductive contact with the carrier.

18. The package according to claim 15, wherein the at least one electronic component comprises at least one first electric terminal at the upper main surface and comprises at least one second electric terminal at the lower main surface.

19. The package according to claim 15, wherein the at least one interconnect structure is selected from a group consisting of a clip, a bond wire, and a bond ribbon.

20. The package according to claim 15, wherein the at least one electronic component comprises at least one of the group consisting of a semiconductor chip, a power semiconductor chip, an active electronic device, a passive electronic device, a sensor, an actuator, and a microelectromechanical system.

21. The package according to claim 15, wherein the at least one gap is filled with air.

* * * * *